US012469680B2

(12) United States Patent
Guo et al.

(10) Patent No.: US 12,469,680 B2
(45) Date of Patent: Nov. 11, 2025

(54) RADIO-FREQUENCY (RF) MATCHING NETWORK FOR FAST IMPEDANCE TUNING

(71) Applicant: Applied Materials, Inc., Santa Clara, CA (US)

(72) Inventors: Yue Guo, Redwood City, CA (US); A N M Wasekul Azad, Santa Clara, CA (US); Kartik Ramaswamy, San Jose, CA (US); Nicolas J. Bright, Arlington, WA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 18/207,526

(22) Filed: Jun. 8, 2023

(65) Prior Publication Data
US 2024/0412947 A1    Dec. 12, 2024

(51) Int. Cl.
*H01J 37/32* (2006.01)

(52) U.S. Cl.
CPC .. *H01J 37/32183* (2013.01); *H01J 37/32128* (2013.01)

(58) Field of Classification Search
CPC ........... H01J 37/32082; H01J 37/32128; H01J 37/32146; H01J 37/32183; H01J 37/32926; H01J 37/32935
See application file for complete search history.

(56) References Cited

U.S. PATENT DOCUMENTS

| | | | |
|---|---|---|---|
| 10,790,784 B2* | 9/2020 | Jurkov | H03F 1/565 |
| 12,165,844 B2* | 12/2024 | Marakhtanov | H01J 37/32091 |
| 2007/0221331 A1 | 9/2007 | Lee | |
| 2010/0243606 A1 | 9/2010 | Koshimizu et al. | |
| 2014/0361690 A1 | 12/2014 | Yamada et al. | |
| 2019/0318919 A1* | 10/2019 | Lyndaker | H01J 37/32935 |
| 2020/0144032 A1* | 5/2020 | Ulrich | H01L 21/67069 |
| 2020/0185195 A1* | 6/2020 | Haga | H01J 37/32183 |
| 2020/0381214 A1 | 12/2020 | Leray et al. | |
| 2022/0076923 A1* | 3/2022 | Carroll | H05H 1/46 |

FOREIGN PATENT DOCUMENTS

KR    20200069245 A    6/2020

OTHER PUBLICATIONS

International Search Report and Written Opinion for International Application No. PCT/US2024/023851 dated Jul. 26, 2024.

* cited by examiner

*Primary Examiner* — Tung X Le

(57) ABSTRACT

Some embodiments are directed to a tuning circuit. The tuning circuit generally includes: a first impedance coupled between a first terminal and a second terminal of the tuning circuit, wherein the first terminal is coupled to a generator and the second terminal is coupled to a load; a second impedance coupled between the first impedance of the tuning circuit and a reference potential node; and a signal path coupled to the first impedance or the second impedance, the signal path comprising an inductive element and a first switch coupled to the inductive element, wherein a control input of the first switch is coupled to a control input of the tuning circuit configured to receive a control signal associated with a pulsed voltage (PV) waveform.

17 Claims, 15 Drawing Sheets

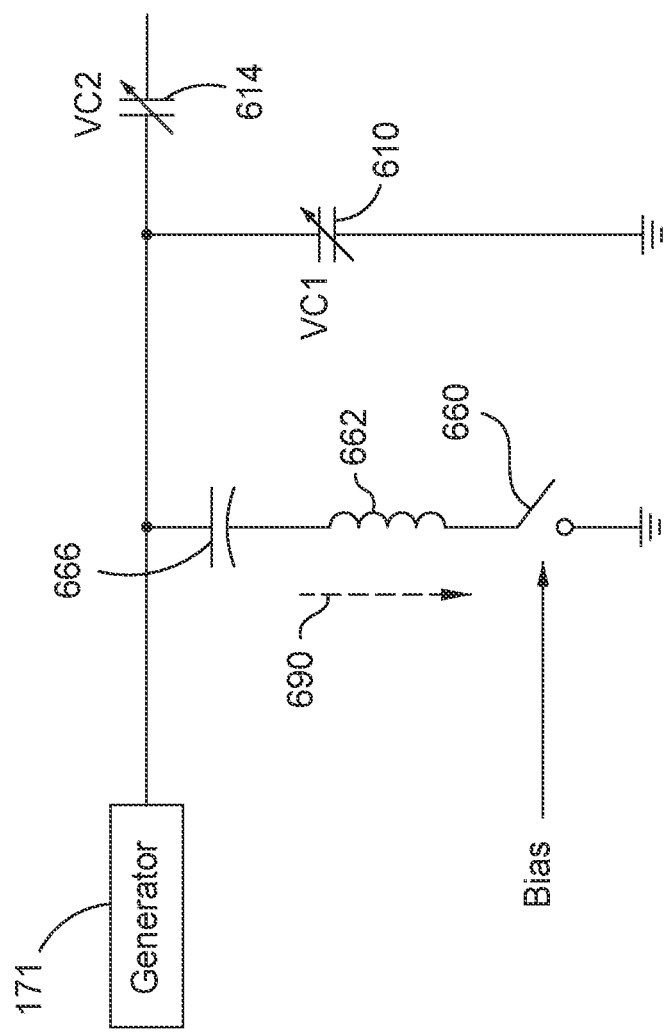

700

```
┌─────────────────────────────────────────────────────────────┐
│   GENERATE A CONTROL SIGNAL BASED ON A PULSED VOLTAGE       │
│   (PV) WAVEFORM PROVIDED TO AN ELECTRODE OF A PROCESSING    │
│                           CHAMBER                           │
│                             710                             │
└─────────────────────────────────────────────────────────────┘
                              │
┌─────────────────────────────────────────────────────────────┐
│     PROVIDE THE CONTROL SIGNAL TO A CONTROL INPUT FOR A     │
│     TUNING CIRCUIT, THE TUNING CIRCUIT FURTHER COMPRISES:   │
│    A FIRST IMPEDANCE COUPLED BETWEEN A FIRST TERMINAL AND   │
│  A SECOND TERMINAL OF THE TUNING CIRCUIT, WHEREIN THE FIRST │
│      TERMINAL IS COUPLED TO A GENERATOR AND THE SECOND      │
│  TERMINAL IS COUPLED TO A LOAD; A SECOND IMPEDANCE COUPLED  │
│    BETWEEN THE FIRST IMPEDANCE AND A REFERENCE POTENTIAL    │
│   NODE; AND A SIGNAL PATH COUPLED TO THE FIRST IMPEDANCE OR │
│     THE SECOND IMPEDANCE, THE SIGNAL PATH COMPRISING AN     │
│     INDUCTIVE ELEMENT AND A FIRST SWITCH COUPLED TO THE     │
│    INDUCTIVE ELEMENT, WHEREIN A CONTROL INPUT OF THE FIRST  │
│     SWITCH IS COUPLED TO THE CONTROL INPUT OF THE TUNING    │
│                           CIRCUIT                           │
│                             720                             │
└─────────────────────────────────────────────────────────────┘
```

FIG. 7

RADIO-FREQUENCY (RF) MATCHING NETWORK FOR FAST IMPEDANCE TUNING

BACKGROUND

Field

Embodiments of the present invention generally relate to a system and methods used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

A typical RIE plasma processing chamber includes a radio frequency (RF) bias generator, which supplies an RF voltage to a power electrode. In a capacitive coupled gas discharge, the plasma is created by using an RF generator that is coupled to the power electrode that is disposed within an electrostatic chuck (ESC) assembly or within another portion of the processing chamber. Typically, an RF matching network ("RF match") tunes an RF waveform provided from the RF generator to deliver RF power to an apparent load of 500 to minimize the reflected power and maximize the power delivery efficiency. If an impedance of the load is not properly matched to an impedance of a source (e.g., the RF generator), a portion of the forward delivered RF waveform can reflect back in an opposite direction along a same transmission line.

A number of plasma processes also utilize DC voltage pulsing schemes to control the plasma sheath disposed over the substrate that is being processed. During operation, the DC voltage pulses cause a generated plasma sheath to toggle between states that includes a thick plasma sheath and state where no plasma sheath exists. Typical, DC pulsing techniques are configured to deliver voltage pulses at a frequency greater than 100 kHz (e.g., 400 kHz). The toggling of the plasma sheath due to the delivery DC pulsed voltage waveform results in the plasma load having different impedance values over time. It has been found that due to the interaction between the RF waveform and DC pulsed voltage waveform that are simultaneously provided during the plasma processing can lead differing plasma processing results due in large part to the RF matching portion of the RF power delivery system's inability to adjust the RF matching point to account for the rapidly changing plasma load impedance values over time.

Conventional impedance matching components and matching processes are unable to keep up with the rapid changes in magnitude of the plasma load impedance, thus causing the RF match to find undesirable matching points that typically leads to the generation of varying amounts of RF power that are actually delivered to the plasma load due to 1) inter-modulation distortion (IMD) of the RF signal, and 2) undesirably high reflected RF powers found at harmonics of the driven RF frequency. The inter-modulation distortion created by the interaction between the RF and DC pulsed voltage waveforms causes the amplitude of at least the RF signal to vary over time. The interaction or intermodulation between the RF and DC pulsed voltage waveforms causes additional undesirable waveform components to form at frequencies that are not just at harmonic frequencies (i.e., integer multiples) of the interacting signals, such as either of the RF or DC pulsed waveforms. The generation of the IMD components in a power delivery system will reduce the actual forward RF power that is delivered to the plasma load. Due at least to unavoidable differences in processing chamber power delivery configurations and differences in the power delivery components, the rapidly changing plasma load impedance values cause undesirable differences in the plasma processing results seen in a single plasma processing chamber, seen in similarly configured processing chambers on a single processing system, and also seen in similarly configured plasma processing chambers within different plasma processing systems within a semiconductor fabrication site. Moreover, the generated IMD components are also not easily accounted for in most power delivery systems due to the broad range of frequencies that can develop during plasma processing in the same or different processing chambers and thus will cause unexpected variations in the power actually delivered to the plasma load during plasma processing.

Thus, there is a need in the art for plasma processing devices and biasing methods that are at least able to resolve this issues outlined above.

SUMMARY

Embodiments provided herein generally include apparatus, plasma processing systems and methods for adjusting impedance tuning in a radio frequency (RF) plasma processing system for fast impedance matching.

Some embodiments are directed to a tuning circuit. The tuning circuit generally includes: a first impedance coupled between a first terminal and a second terminal of the tuning circuit, wherein the first terminal is coupled to a generator and the second terminal is coupled to a load; a second impedance coupled between the first impedance and a reference potential node; and a signal path coupled to the first impedance or the second impedance, the signal path comprising an inductive element and a first switch coupled to the inductive element, wherein a control input of the first switch is coupled to a control input of the tuning circuit configured to receive a control signal associated with a pulsed voltage (PV) waveform.

Some embodiments are directed to a method of processing a substrate in a plasma processing system. The method generally includes: generating a control signal based on a PV waveform provided to an electrode of a processing chamber; and providing the control signal to a control input for a tuning circuit, the tuning circuit further comprises: a first impedance coupled between a first terminal and a second terminal of the tuning circuit, wherein the first terminal is coupled to a generator and the second terminal is coupled to the processing chamber; a second impedance coupled between the first impedance and a reference potential node; and a signal path coupled to the first impedance or the second impedance, the signal path comprising an inductive element and a first switch coupled to the inductive element, wherein a control input of the first switch is coupled to the control input of the tuning circuit.

Some embodiments are directed to an apparatus for processing a substrate in a plasma processing system. The apparatus generally includes: a PV waveform generator configured to generate a PV waveform provided to an electrode of a processing chamber; a tuning circuit including: a first impedance coupled between a first terminal and a second terminal of the tuning circuit; a second impedance coupled between the first terminal of the tuning circuit and a reference potential node; and a signal path coupled to the first impedance or the second impedance, the signal path comprising an inductive element and a first switch coupled to the inductive element, wherein a control input of the first switch is coupled to a control input of the tuning circuit; and a controller configured to provide a control signal to the control input of the tuning circuit based on the PV waveform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6A-6H are example schematic representations of a tuning circuit, in accordance with certain embodiments of the present disclosure.

FIG. 7 is a process flow diagram illustrating a method for processing a substrate in a plasma processing system, in accordance with certain embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include apparatus and methods for impedance tuning in a radio frequency (RF) plasma processing system for fast impedance matching (e.g., to match an impedance of a plasma load to an impedance of an RF source such as an RF generator).

In the RF plasma processing system, a plasma load impedance varies depending on the state of the plasma chamber. For example, a pulsed voltage (PV) waveform may be provided to an electrode within the chamber. The impedance associated with the formation of plasma in the chamber may change depending on the state of the PV waveform (e.g., whether the waveform is in a sheath collapse stage or ion current stage). Usually, an RF matching network may be implemented to match distinct impedances, however, a conventional RF matching network cannot match to two or more distinct impedances within a cycle of the PV waveform, and therefore periodic reflected power spikes may occur due to the imperfect impedance matched stage. The periodic reflected power spikes may cause unexpected variations in the RF power delivered to the plasma load during plasma processing.

Techniques described herein may be used to provide impedance matching in response to fast impedance changes associated with the formation of the plasma in the chamber. For example, the fast impedance changes occurring within a PV waveform cycle may be matched using a tuning circuit having one or more switches that may be controlled to change an impedance associated with the tuning circuit. Thus, the tuning circuit may match to a high impedance state when the PV waveform generator is in an "off" stage (e.g., sheath collapse stage) and match to a low impedance stage when the PV waveform generator is in an "on" stage (e.g., ion current stage). The techniques described herein provide several advantages. For example, the techniques provide fast tuning speed to match impedance changes during a cycle of the PV waveform, lowering reflected power, increasing power delivery efficiency, and increasing etch rate.

Plasma Processing System Examples

Figure 1A:
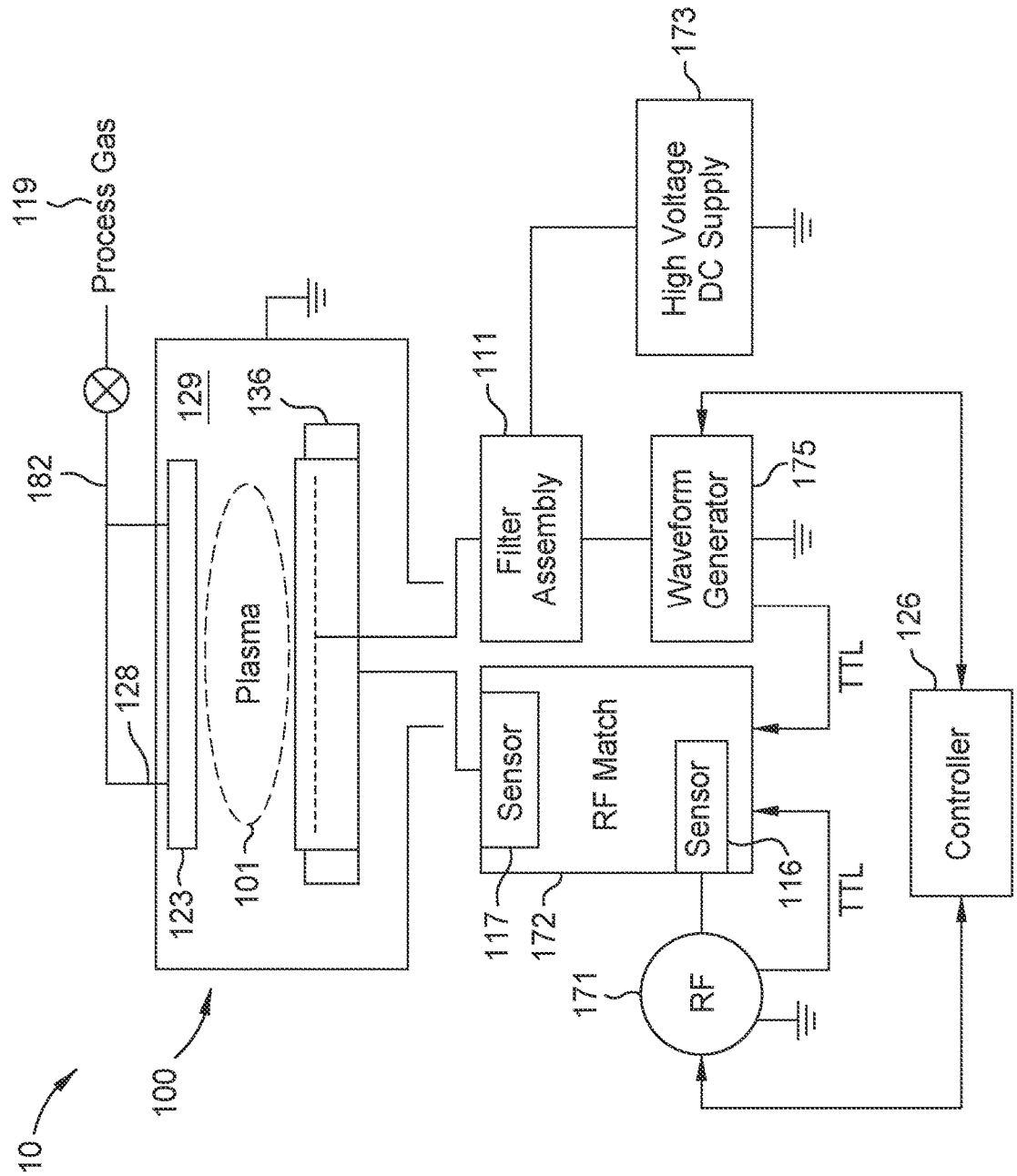
FIG. 1A is a schematic representation of a plasma processing system, in accordance with certain embodiments of the present disclosure.

FIG. 1A is a schematic representation of a plasma processing system. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma-enhanced atomic layer deposition (PEALD) processes, plasma treatment processing, plasma-based ion implant processing, or plasma doping (PLAD) processing. In one configuration, as shown in FIG. 1A, the plasma processing system 10 is configured to form a capacitive coupled plasma (CPP). However, in some embodiments, a plasma may alternately be generated by an inductively coupled source disposed over a processing region of the plasma processing system 10.

The plasma processing system 10 includes a processing chamber 100, a substrate support assembly 136, a gas delivery system 182, a high DC voltage supply 173, a radio frequency (RF) generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100.

The processing chamber 100 includes an upper electrode (e.g., the chamber lid 123) and a lower electrode (e.g., the substrate support assembly 136) positioned in the processing volume 129 of the processing chamber 100. The upper and lower electrodes face one another. In one embodiment, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode. For example, the RF generator 171 may deliver an RF source power to an RF baseplate within a cathode assembly (e.g., in the substrate support assembly 136) for plasma production, whereas the upper electrode is grounded. A center frequency of the RF source power can be from 13.56 MHz to very high frequency band such as 40 MHZ, 60 MHZ, 120 MHz or 162 MHZ. In some examples, the RF source power can also be delivered through the upper electrode. The RF source power can be operated in a continuous mode or a pulsed mode. A pulsing frequency of the RF power can be from 100 to 10 kHz, and duty cycles are ranging from 5% to 95%. The RF generator 171 has a frequency tuning capability and can adjust its RF power frequency within e.g., ±5% or ±10%. In some embodiments, the RF generator 171 switches the RF power frequency at a predefined speed (e.g., two nanoseconds, fifty nanoseconds, etc.).

The substrate support assembly 136 may be coupled to a high voltage DC supply 173 that supplies a chucking voltage thereto. The high voltage DC supply 173 may be coupled to a filter assembly 178 that is disposed between the high DC voltage supply 173 and the substrate support assembly 136.

The filter assembly 178 is configured to electronically isolate the high voltage DC supply 173 during plasma processing. In one configuration, a static DV voltage is between about −5000V and about 5000V, and is delivered using an electrical conductor (such as a coaxial power delivery line). The filter assembly 178 may include multiple filtering components or a single common filter.

The substrate support assembly 136 is coupled to a pulsed voltage (PV) waveform generator 175 configured to supply a PV to bias the substrate support assembly 136. The PV waveform generator 175 is coupled to the filter assembly 178. The filter assembly 178 is disposed between the PV waveform generator 175 and the substrate support assembly 136. The filter assembly 178 is configured to electronically isolate the PV waveform generator 175 during plasma processing.

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, it is necessary to find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The RF generator 171 and the PV waveform generator 175 are each directly coupled to a system controller 126. The system controller 126 synchronizes the respective generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either of the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode (e.g., a bias electrode 104 shown in FIG. 1B) through the filter assembly 178. The high DC voltage supply 173 is applied to chuck a wafer during a process for a thermal control. In some cases, there can be a third electrode at an edge of the cathode assembly for edge uniformity control.

Figure 1B:
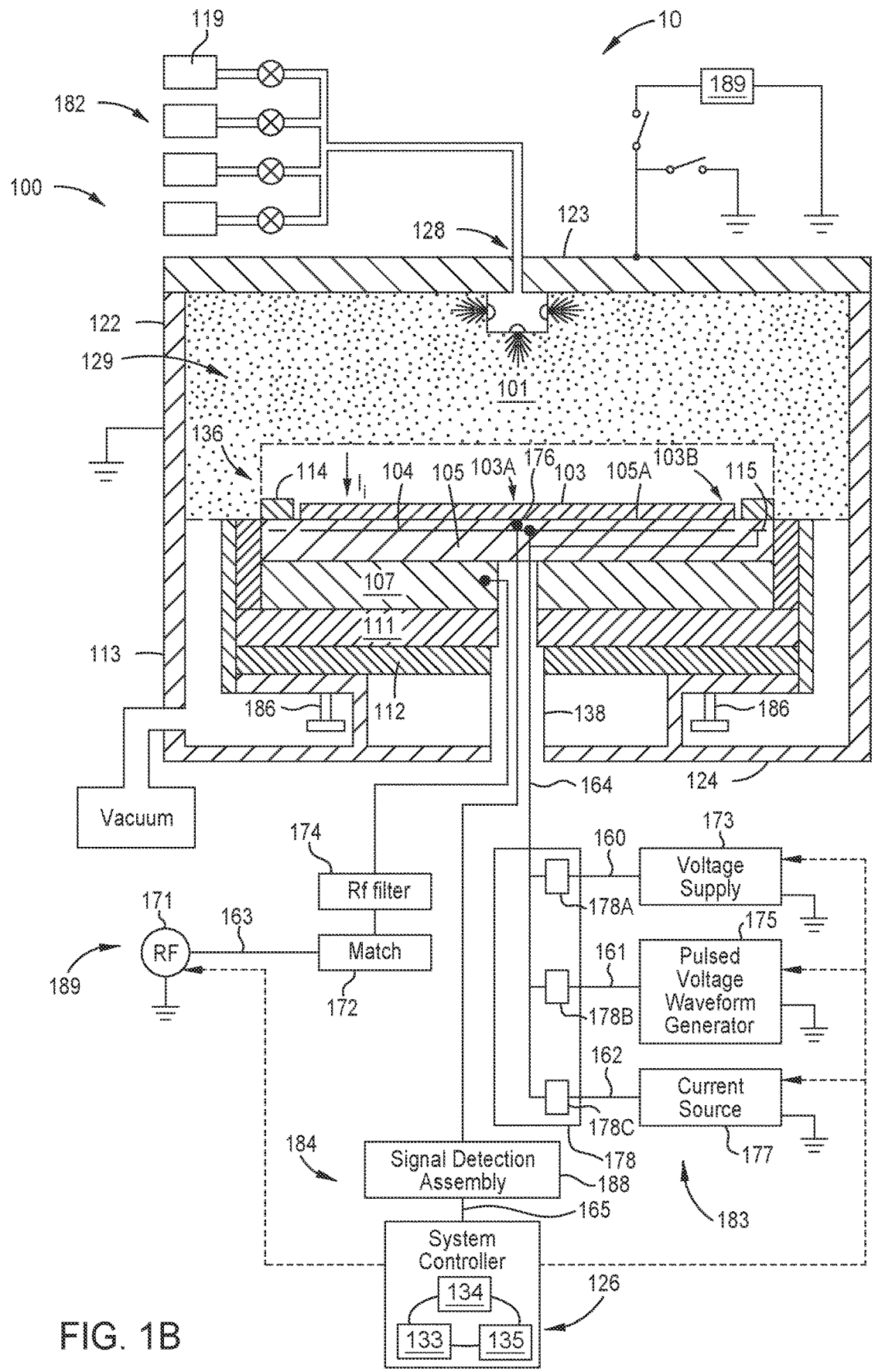
FIG. 1B is a schematic detailed cross-sectional view of the plasma processing system, in accordance with certain embodiments of the present disclosure.

FIG. 1B is a schematic detailed cross-sectional view of the plasma processing system 10. As shown in FIG. 1B, the plasma processing system 10 is configured to form a capacitively coupled plasma (CCP). However, in some embodiments, the plasma 101 may alternately be generated by an inductively coupled source disposed over the processing region of the plasma processing system 10. In this configuration, a coil may be placed on top of a ceramic lid (e.g., vacuum boundary) of the plasma processing chamber 100.

The plasma processing system 10 includes the processing chamber 100, the substrate support assembly 136, the gas delivery system 182, a DC power system 183, an RF power system 189, and the system controller 126. The processing chamber 100 includes a chamber body 113 that includes the chamber lid 123, one or more sidewalls 122, and a chamber base 124. The chamber lid 123, the one or more sidewalls 122, and the chamber base 124 collectively define the processing volume 129 of the processing chamber 100. The one or more sidewalls 122 and the chamber base 124 include materials (such as aluminum, aluminum alloys, or stainless steel alloys) that are sized and shaped to form a structural support for elements of the processing chamber 100 and are configured to withstand the pressures and added energy applied to them while the plasma 101 is generated within a vacuum environment maintained in the processing volume 129 of the processing chamber 100 during processing. A substrate 103 is loaded into, and removed from, the processing volume 129 of the processing chamber 100 through an opening (not shown) in one of the sidewalls 122. The opening is sealed with a slit valve (not shown) during plasma processing of the substrate 103.

The gas delivery system 182, which is coupled to the processing volume 129 of the processing chamber 100, includes the processing gas source 119 and the gas inlet 128 disposed through the chamber lid 123. The gas inlet 128 is configured to deliver one or more processing gases to the processing volume 129 of the processing chamber 100 from the processing gas source 119.

As noted above, the processing chamber 100 includes the upper electrode (e.g., the chamber lid 123) and the lower electrode (e.g., the substrate support assembly 136) disposed in the processing volume 129 of the processing chamber 100. The upper electrode and lower electrode are positioned to face each other. As seen in FIG. 1B, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode.

The substrate support assembly 136 includes a substrate support 105, a substrate support base 107, an insulator plate 111, a ground plate 112, a plurality of lift pins 186, one or more substrate potential sensing assemblies 184 (e.g., including a signal detecting assembly 188), and a bias electrode 104. Each of the lift pins 186 are disposed through a through hole 185 formed in the substrate support assembly 136 and are used to facilitate the transfer of the substrate 103 to and from a substrate receiving surface 105A of the substrate support 105. The substrate support 105 is formed of a dielectric material. The dielectric material can include a bulk sintered ceramic material, a corrosion-resistant metal oxide (for example, aluminum oxide ($Al_2O_3$), titanium oxide (TiO), yttrium oxide ($Y_2O_3$), a metal nitride material (for example, aluminum nitride (AlN), titanium nitride (TiN)), mixtures thereof, or combinations thereof.

The substrate support base 107 is formed of a conductive material (for example aluminum, an aluminum alloy, or a stainless steel alloy). The substrate support base 107 is electrically isolated from the chamber base 124 by the insulator plate 111, and the ground plate 112 interposed between the insulator plate 111 and the chamber base 124. The substrate support base 107 is configured to regulate the temperature of both the substrate support 105, and the substrate 103 disposed on the substrate support 105 during substrate processing. The substrate support base 107 includes one or more cooling channels (not shown) disposed therein that are fluidly coupled to, and in fluid communication with, a coolant source (not shown), such as a refrigerant source or substrate source having a relatively high electrical resistance. The substrate support 105 includes a heater (not shown) to heat the substrate support 105 and the substrate 103 disposed on the substrate support 105.

The bias electrode 104 is embedded in a dielectric material of the substrate support 105. The bias electrode 104 is formed of one or more electrically conductive parts. The electrically conductive parts include meshes, foils, plates, or combinations thereof. The bias electrode 104 functions as a chucking pole (i.e., electrostatic chucking electrode) that is used to secure (e.g., electrostatically chuck) the substrate 103 to the substrate receiving surface 105A of the substrate support 105. A parallel plate like structure is formed by the bias electrode 104 and a layer of the dielectric material that is disposed between the bias electrode 104 and the substrate receiving surface 105A. The dielectric material can have an effective capacitance CE of between about 5 nF and about 50 nF. A layer of the dielectric material (e.g., aluminum nitride (AlN), aluminum oxide ($Al_2O_3$), etc.) has a thickness between about 0.3 mm and about 5 mm, such as between about 0.1 mm and about 3 mm, such as between about 0.1 mm and about 1 mm, or even between about 0.1 mm and 0.5 mm. The bias electrode 104 is electrically coupled to a clamping network, which provides a chucking voltage thereto. The clamping network includes the DC voltage supply 173 (e.g., a high voltage DC supply) that is coupled to a filter 178A of the filter assembly 178 that is disposed between the DC voltage supply 173 and the bias electrode 104. The filter 178A is a low-pass filter that is configured to block RF frequency and PV waveform signals provided by other biasing components found within the processing chamber 100 from reaching the DC voltage supply 173 during the plasma processing. The static DV voltage is between about −5000V and about 5000V, and is delivered using an electrical conductor (such as a coaxial power delivery line 106). The bias electrode 104 may bias the substrate 103 with the respect to the plasma 101 using one or more of the PV biasing schemes.

The substrate support assembly 136 includes an edge control electrode 115. The edge control electrode 115 is formed of one or more electrically conductive parts. The electrically conductive parts include meshes, foils, plates, or combinations thereof. The edge control electrode 115 is positioned below an edge ring 114 and surrounds the bias electrode 104 and/or is disposed a distance from a center of the bias electrode 104. For the processing chamber 100 that is configured to process circular substrates, the edge control electrode 115 is annular in shape, is made from a conductive material, and is configured to surround at least a portion of the bias electrode 104. As seen in FIG. 1B, the edge control electrode 115 is positioned within a region of the substrate support 105, and is biased by use of the PV waveform generator 175. The edge control electrode 115 is biased by use of a PV waveform generator that is different from the PV waveform generator 175 used for the bias electrode 104. The edge control electrode 115 is biased by splitting part of a signal provided from the PV waveform generator 175 to the bias electrode 104.

The DC power system 183 includes the DC voltage supply 173, the PV waveform generator 175, and a current source 177. The RF power system 189 includes the RF waveform generator 171, the RF matching circuit 172, and an RF filter 174. As shown in FIG. 1B, a power delivery line 163 electrically connects an output of the RF generator 171 to the RF matching circuit 172, the RF filter 174 and the substrate support base 107. As noted above, during the plasma processing, the DC voltage supply 173 provides a constant chucking voltage, while the RF generator 171 delivers the RF signal to the processing region, and the PV waveform generator 175 establishes the PV waveform at the bias electrode 104. For example, a sufficient amount of the RF power is applied to an RF bias voltage signal (which is also referred to herein as the RF waveform), and the RF waveform is provided to an electrode (e.g., the substrate support base 107) to cause the plasma 101 to be formed in the processing volume 129 of the processing chamber 100. The RF waveform has a frequency range between about 1 MHz and about 200 MHz, such as between 2 MHz and 40 MHz.

The DC power system 183 includes the filter assembly 178 to electrically isolate one or more of the components contained within the DC power system 183. A power delivery line 160 electrically connects an output of the DC voltage supply 173 to the filter assembly 178. A power delivery line 161 electrically connects the output of the PV waveform generator 175 to the filter assembly 178. A power delivery line 162 connects the output of the current source 177 to the filter assembly 178.

The current source 177 is selectively coupled to the bias electrode 104 by use of a switch (not shown) disposed in the power delivery line 162, to allow the current source 177 to deliver a desired current to the bias electrode 104 during one or more stages (e.g., ion current stage) of the voltage waveform generated by the PV waveform generator 175.

The filter assembly 178 includes multiple separate filtering components (i.e., discrete filters 178A-178C) that are each electrically coupled to an output node via a power delivery line 164. The filter assembly 178 may include one common filter electrically coupled to the output node via the power delivery line 164. The power delivery lines 160-164 include electrical conductors that include a combination of coaxial cables, such as a flexible coaxial cable that is connected in series with a rigid coaxial cable, an insulated high-voltage corona-resistant hookup wire, a bare wire, a metal rod, an electrical connector, of any combination of the above.

The system controller 126, also referred to herein as a processing chamber controller, includes a central processing unit (CPU) 133, a memory 134, and support circuits 135. The system controller 126 is used to control a process sequence used to process the substrate 103. The CPU is a computer processor configured for use in an industrial setting for controlling the processing chamber and sub-processors related thereto. The memory 134 described herein, which is generally non-volatile memory, can include random access memory, read-inly memory, hard disk drive, or other suitable forms of digital storage, local or remote. The support circuits 135 are coupled to the CPU 133 and include cache, clock circuits, input/output subsystems, power supplied, and the like, and combinations thereof. Software instructions (program) and data can be coded and stored within the memory 134 for instructing a processor within the CPU 133. A software program (or computer instructions) readable by the CPU 133 in the system controller 126 determines which tasks are performable by the components in the plasma processing system 10.

The program, which is readable by the CPU 133 in the system controller 126 includes code, which, when executed by the CPU 133, performs tasks relating to the plasma processing schemes described herein. The program may include instructions that are used to control the various hardware and electrical components within the plasma processing system 10 to perform the various process tasks and various process sequences used to implement the methods described herein. The program includes instructions that are used to perform one or more of the operations described herein.

Figure 2:
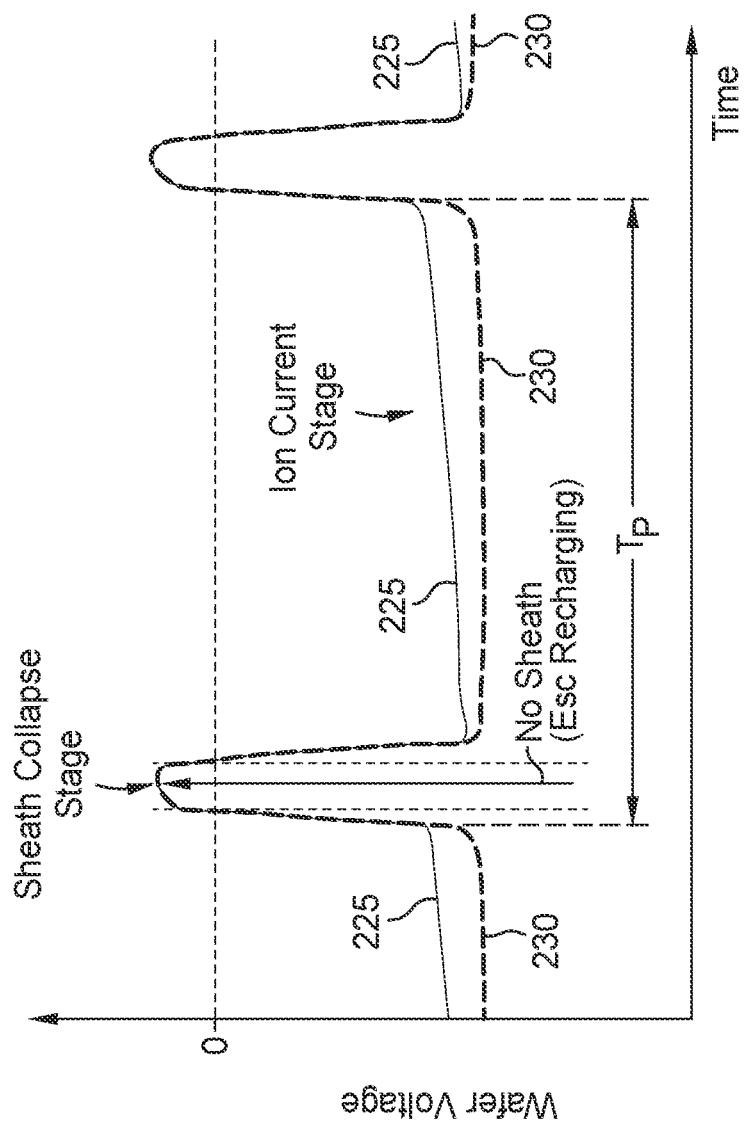
FIG. 2 shows a voltage waveform that is established on a substrate due to a voltage waveform applied to an electrode of a processing chamber, in accordance with certain embodiments of the present disclosure.

FIG. 2 illustrates two separate voltage waveforms established at the substrate 103 disposed on the substrate receiving surface 105A of the substrate support assembly 136 of the processing chamber 100 due to the delivery of PV waveforms to the bias electrode 104 of the processing chamber 100. A first waveform (e.g., a waveform 225) is an example of a non-compensated PV waveform established at the substrate 103 during the plasma processing. A second waveform (e.g., a waveform 230) is an example of a compensated PV waveform established at the substrate 103 by applying a negative slope waveform to the bias electrode 104 of the processing chamber 100 during an "ion current stage" portion of the PV waveform cycle by use of the current source 177. The compensated PV waveform can alternatively be established by applying a negative voltage ramp during the ion current stage of the PV waveform generated by the PV waveform generator 175. The PV waveform cycle of the waveforms 225, 230 each have a period $T_p$, which is, for example, typically between 2 microsecond (µs) and 10 µs, such as 2.5 µs. The ion current stage of the PV waveform cycle will typically take up between about 50% and about 95% of the period $T_p$, such as from about 80% to about 90% of the period $T_p$.

The waveforms 225 and 230 include two main stages: an ion current stage and a sheath collapse stage. Both portions (e.g., the ion current stage and the sheath collapse stage) of the waveforms 225 and 230, can be alternately and/or separately established at the substrate 103 during the plasma processing. At a beginning of the ion current stage, a drop in the voltage at the substrate 103 is created, due to the delivery of a negative portion of the PV waveform (e.g., the ion current portion) provided to the bias electrode 104 by the PV waveform generator 175, which creates a high voltage sheath above the substrate 103. The high voltage sheath allows the plasma generated positive ions to be accelerated towards the biased substrate 103 during the ion current stage, and thus, for RIE processes, controls the amount and characteristics of the etching process that occurs on the surface of the substrate 103 during the plasma processing. In some embodiments, it is desirable for the ion current stage to include a region of the PV waveform that achieves the voltage at the substrate 103 that is stable or minimally varying throughout the stage, as illustrated in FIG. 2 by the waveform 230. One will note that significant variations in the voltage established at the substrate 103 during the ion current stage, such as shown by the positive slope in the waveform 225, will undesirably cause a variation in the ion energy distribution (IED) and thus cause undesirable characteristics of the etched features to be formed in the substrate 103 during the RIE process.

Plasma sheath impedance varies with supplied PV waveform voltages. The RF match 172 can use either or both of the synchronization signals and/or use its internal sensors to sample impedances in different processing phases. In one example, a synchronization signal or characteristics determined by the input sensor 116 or the output sensor 117 are used to trigger the RF match 172 to determine at least two different impendences at different processing stages. Then, the RF match 172 updates its matching point based on the at least two different impedances.

Figure 3:
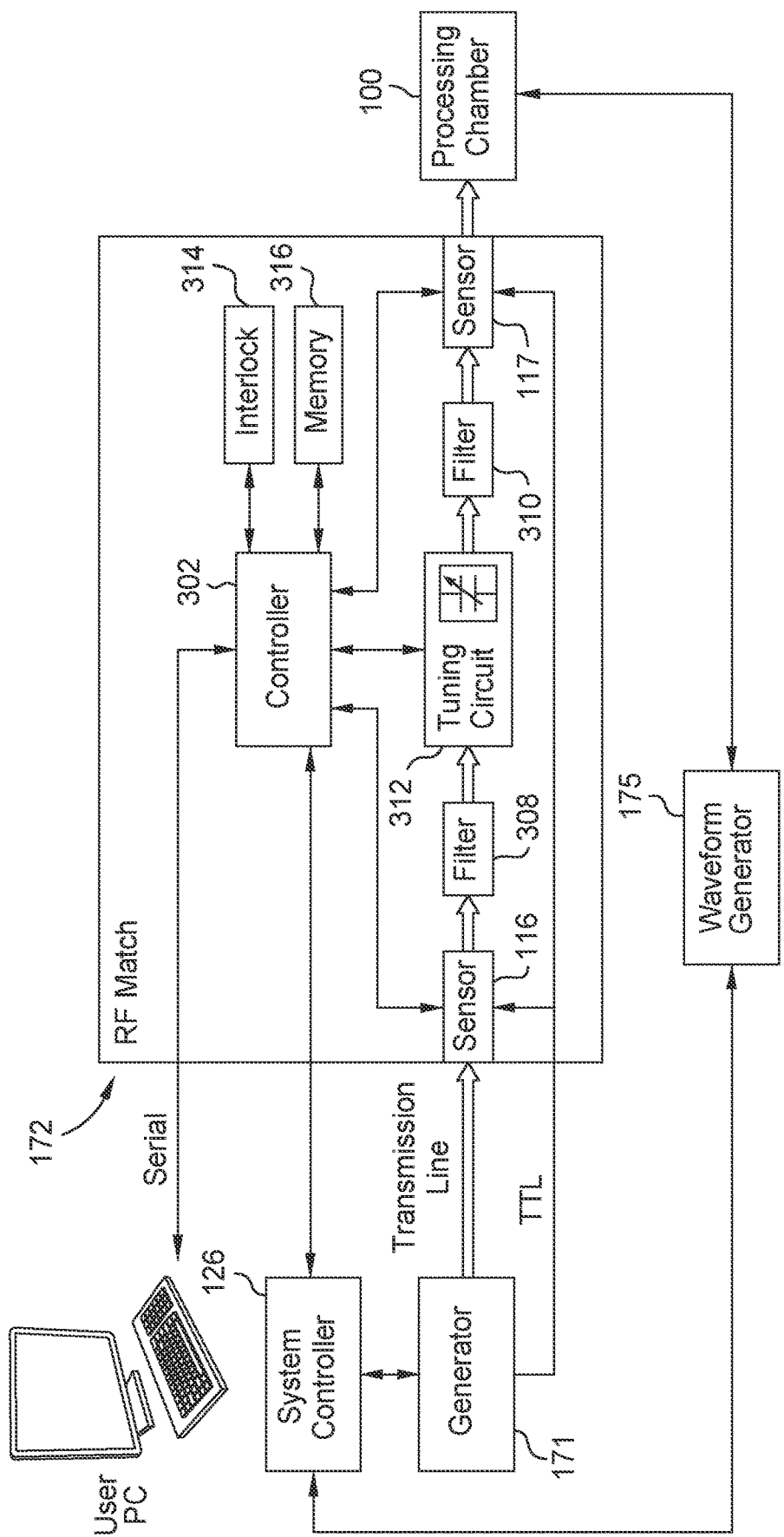
FIG. 3 is a schematic representation of a radio frequency (RF) matching network, in accordance with certain embodiments of the present disclosure.

FIG. 3 is a schematic representation of an RF match 172. The RF match 172 includes a controller 302, the input sensor 116, the output sensor 117, a first RF filter 308, a second RF filter 310, a tuning circuit 312, an interlock 314, and a memory 316. The two RF filter circuits (e.g., the first RF filter 308 and the second RF filter 310) are near both an input and an output of the RF match 172. In some cases, only one RF filter may be used near the output of the RF match 172.

The RF match 172 is connected to the RF generator 171 through a 50Ω transmission line. The RF generator 171 may supply power at frequencies between 100 kHz and 200 MHz. The RF generator 171 has a frequency tuning capability and can adjust its RF power frequency within e.g. ±5% or ±10%. The RF generator 171 sends a TTL signal to the input sensor 116 and the output sensor 117 directly for fast response and better synchronization. The RF match 172 is configured to receive the RF waveform from the RF generator 171, tune the RF waveform to minimize the reflected power and maximize power delivery efficiency, and deliver the tuned RF waveform to the plasma chamber 100. Simultaneously, as noted above, the PV waveform generator 175 is configured to provide the PV waveform to the processing chamber 100. The RF generator 171 and the PV waveform generator 175 are both coupled to and synchronized by the controller 302.

The controller 302 may work with various communication protocols, e.g., RS-232, RS-485, USB, Ethernet, or Ethernet for Control Automation Technology (ECAT). The controller 302 may serve as a local EtherCAT master. Other components (e.g., the input sensor 116, the output sensor 117, motors) are EtherCAT slave devices, which are controlled by the controller 302.

The controller 302 may be coupled to the interlock 314, the memory 316, the tuning circuit 312, the input sensor 116, the output sensor 117, and the system controller 126. The controller 302 includes a CPU. The controller 302 is configured to control the tuning circuit 312 to change an impedance parameter of the RF match 172. In one example, the tuning circuit 312 is a T-network tuning circuit. In another example, the tuning circuit 312 is a pi-network tuning circuit. In another example, the tuning circuit 312 is an L-network tuning circuit. The tuning circuit 312 may include one or more capacitors and inductors that can be adjusted by the controller 302 to change the impedance of the RF waveform delivered to the processing chamber 100.

The system controller 126 can communicate with the RF match 172, the RF generator 171 and/or other chamber components. The controller 302 can communicate with the system controller 126 using EtherCAT. The controller 302 can do a master to slave conversion, which allows communication to the system controller 126 EtherCAT master. The controller 302 receives requests from the system controller 126, and provides feedback. Also, the system controller 126 receives forward and reflected power information from the RF generator 171 and gets data from all internal devices of the RF match 172. The RF generator 171 can also be controlled by the system controller 126 for a cooperative intelligent real time control and tuning.

The memory 316 may be programmed for long term or short term memory storage. The memory 316 described herein, which is generally non-volatile memory, can include random access memory, read-only memory, hard disk drive, or other suitable forms of digital storage, local or remote. Software instructions (program) and data can be coded and stored within the memory 316 for instructing a processor within the controller 302. A software program (or computer instructions) readable by controller 302 determines which tasks are performable by the components in the plasma processing system 10. The program, which is readable by the controller 302 includes code, which, when executed, performs tasks relating to the plasma processing schemes described herein. The program may include instructions that are used to control the RF match 172 using the methods described herein. The program includes instructions that are used to perform one or more of the operations described herein.

The interlock 314 is implemented for safety purposes to control over temperature switches, cable-in-place switches, and match-in-place switches, etc. The interlock 314 is open when failure happens, and an interlock signal will be sent from a local microcontroller to both a user laptop and the system controller 126 to shut the system off.

The RF match 172 may include a serial control port for algorithm uploading, and an external match control (e.g., by using an external software and application programming interface (API)). Automatic impedance tuning algorithms and preset variable capacitor positions are stored on the memory 316. Sensor data and tuning algorithms can be accessed from an external user laptop, which provides great flexibility to the RF match 172. Furthermore, advanced process related control algorithm can be deployed in real time. The RF match 172 can operate fully autonomously, cooperatively with the system controller 126 or manually controlled by the external user laptop.

The output sensor 117 may include a voltage sensor and/or a current sensor configured to measure the impedances or the characteristics of the plasma processing system 10 explained above. The input sensor 116 may include a voltage sensor and/or a current sensor configured to measure characteristics of the RF waveform such as voltage, current, phase, or harmonics. In some cases, only one sensor can be used at the input of the RF match 172. Sensor readings can be used in a feedback and feedforward algorithms for impedance matching.

The output sensor 117 is configured to sample a first set of impedances of the plasma processing system 10 over a first period of time and report them to the controller 302. The output sensor 117 is also configured to sample a second set of impedances of the plasma processing system 10 over a second period of time and report them to the controller 302. The first period of time may begin after a first delay that is triggered (i.e. measured) after a first portion of a waveform pulse of a synchronization signal or internally by the sensors detecting a change in a characteristic of the PV waveform or the RF waveform. The second period of time may begin after a second delay that is triggered at the same time as the first delay. The second delay is longer than the first delay.

The controller 302 uses the both sets of impedances to determine a first impedance and a second impedance and combine them into a combined impedance. Then, based on the combined impedance parameter, the controller 302 adjusts the one or more capacitor(s) of the tuning circuit 312 to change the matching point of the RF match 172 so that the impedance of the generated RF waveform matches the impedance of the plasma processing system 10. Then, after adjusting the tuning circuit 312 based on the combined impedance parameter, the controller 302 may further fine tune the tuning circuit 312 based on the impedance of the RF waveform sampled by the input sensor 116.

Example Techniques for Fast Tuning of an RF Matching Network

Conventional RF match networks may use variable capacitors for impedance matching. The tuning of the variable capacitors within the RF match network may not be fast enough to track impedance changes within one PV waveform cycle. For example, the RF match network may only tune to one selected impedance. As a result, high reflected power may occur due to an impedance mismatch at other impedance states during plasma processing. Moreover, frequency tuning of the RF match network may only be able to tune for the imaginary part of the impedance, and thus not tune the real part of the impedance.

Certain embodiments of the present disclosure are directed to active RF match and tuning techniques that provide fast impedance tuning. The tuning techniques described herein may provide impedance matching that can match impedance changes when a portion of the PV waveform cycle of a PV waveform is "on" or "off." Using the fast impedance matching results in lower reflected power, better power delivery efficiency, faster etch rate, and improved plasma processing results. Solid-state RF match devices may be faster than traditional RF match devices, but do not support higher frequencies and power. Certain embodiments provide a hybrid RF matching network including a combination of RF match with solid state switch technology for operation with high power and for a wide range of frequencies.

Figure 4:
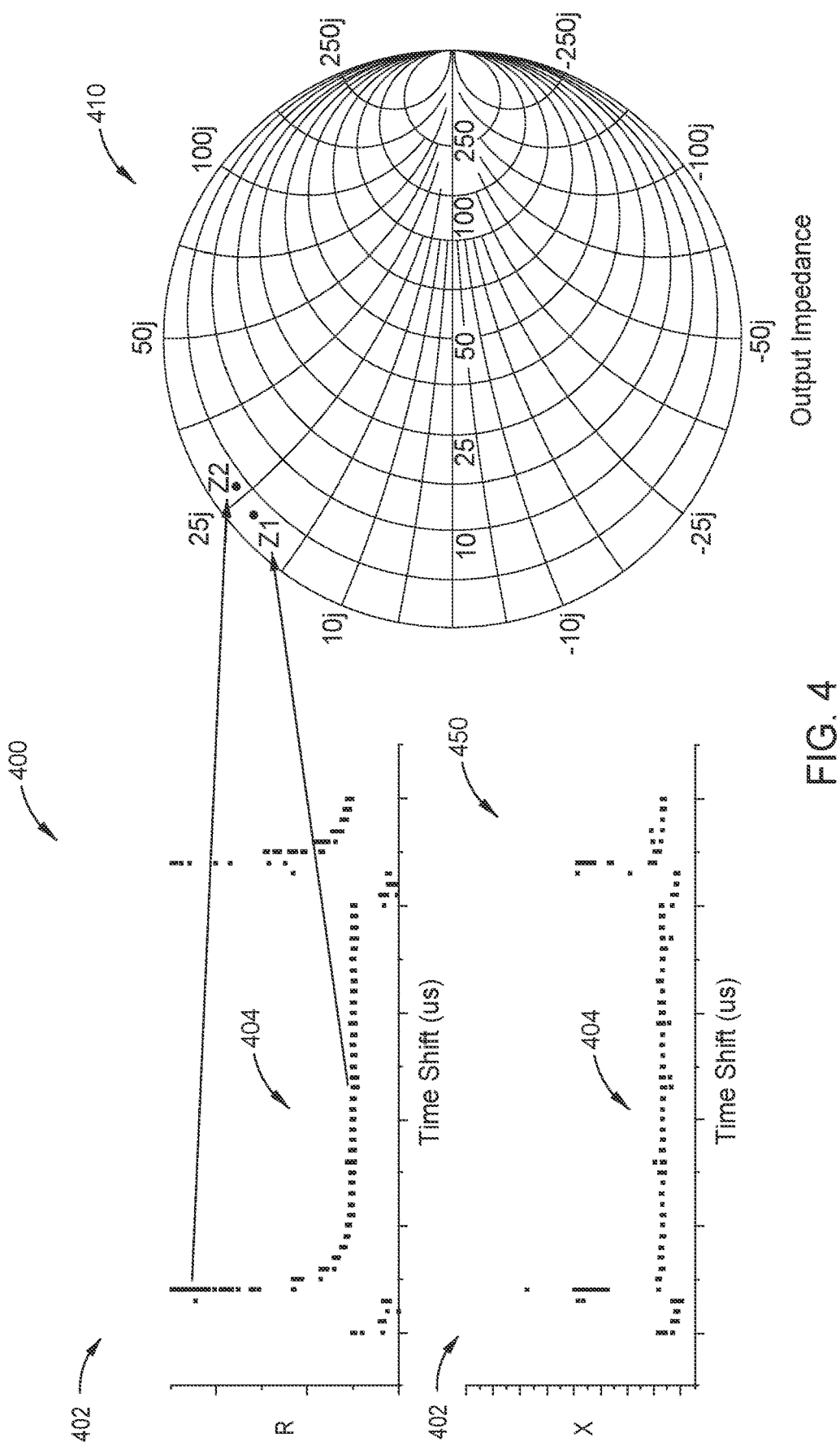
FIG. 4 illustrates a graph showing a real part of impedance associated with a processing chamber and a graph showing an imaginary part of impedance associated with the processing chamber.

FIG. 4 illustrates a graph 400 showing the real part of impedance associated with a processing chamber and a graph 450 showing the imaginary part of the impedance associated with the processing chamber. As shown, during stage 402 (e.g., associated with the sheath collapse stage described with respect to FIG. 2), the processing chamber impedance may be Z2 as shown in Smith chart 410. During stage 404 (e.g., associated with the ion current stage described with respect to FIG. 2), the processing chamber impedance may be Z1, which is lower than Z2. Similarly, the processing chamber may have different imaginary impedances during stages 402, 404, as shown in graph 450. Certain embodiments of the present disclosure are directed impedance matching and tuning techniques that allow for impedance matching to track such changes in impedances, as shown by graphs 400, 450.

Figure 5:
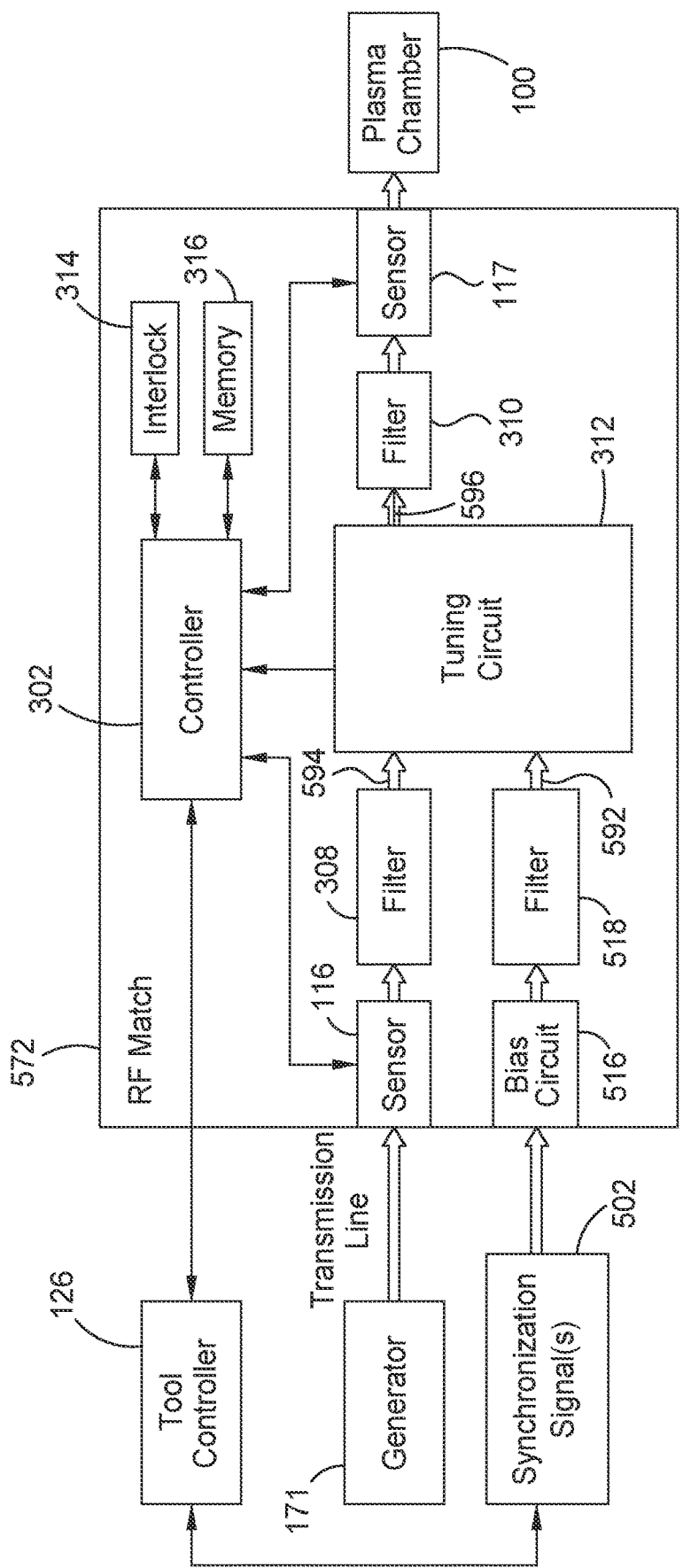
FIG. 5 is a schematic representation of an active RF matching network, in accordance with certain embodiments of the present disclosure.

FIG. 5 is a schematic representation of an active RF match 572 (e.g., corresponding to RF match 172), in accordance with certain embodiments of the present disclosure. As shown, the RF match 572 may include the tuning circuit 312. As shown, the tuning circuit 312 may be controlled by at least one synchronization signal 502. In some embodiments, the synchronization signal 502 may be generated by a controller, such as the controller 126. In some embodiments, the synchronization signal 502 may be provided to the tuning circuit 312 via a switch control path that includes a bias circuit 516 and a filter 518. The bias circuit 516 may be used to bias switches (e.g., transistors) of the tuning circuit 312 through the filter 518 via the control input 592 of the tuning circuit 312. The control input 592 of the tuning circuit 312 may be coupled to a control input of a switch of the tuning circuit 312, as described in more detail herein.

FIGS. 6A to 6G illustrate example schematic representations of the tuning circuit 312, in accordance with certain embodiments of the present disclosure. For ease of representation and discussion purposes, some of the elements illustrated in FIG. 5 have been omitted from the schematics shown in FIGS. 6A to 6G.

Figure 6A:
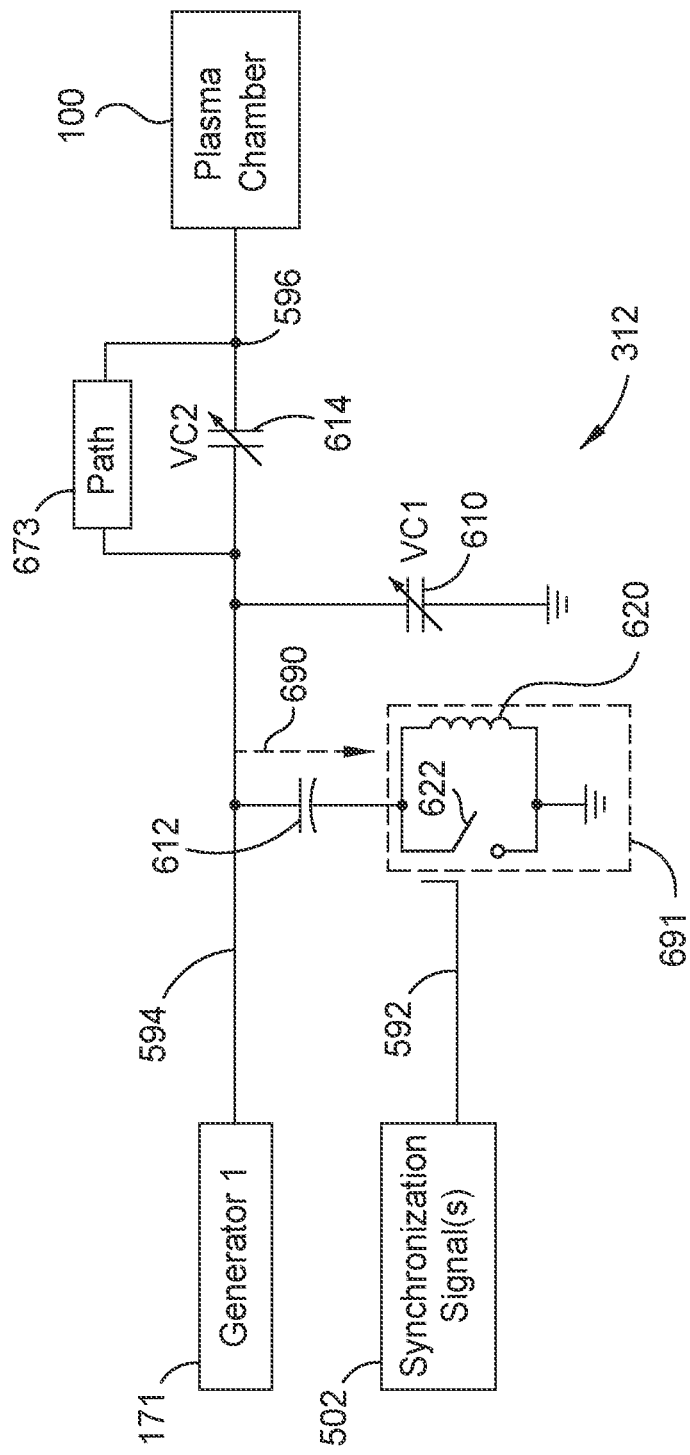

As shown in FIG. 6A, the tuning circuit 312 may include a capacitive element 610 (labeled "VC1") coupled in shunt between terminal 594 of tuning circuit 312 (FIG. 5) and a reference potential node (e.g., electrical ground). The tuning circuit 312 also includes a capacitive element 614 (labeled "VC2") coupled between terminal 594 and terminal 596 of tuning circuit 312 (e.g., the output of the tuning circuit 312 or input of filter 310 shown in FIG. 5).

In some embodiments of the present disclosure, a signal path 690 may be coupled in parallel with capacitive element 610. The signal path 690 may include a capacitive element 612 that is coupled between terminal 594 and a reference potential node (e.g., electrical ground). In some embodiments, the capacitive element 612 may have a fixed capacitance (or may be a tunable capacitive element).

In some embodiments, the tuning circuit 312 may include a parallel circuit 691 within the signal path 690, which includes an inductive element 621 coupled in parallel with a switch 622. As shown, the inductive element 621 and switch 622 may be coupled between the capacitive element 612 and the reference potential node (e.g., electrical ground). The synchronization signal 502 may be used to drive the switch 622. The synchronization signal 502 may be received from any suitable source, such as a generator (e.g., generator 171), a controller (e.g., controller 126), or a pulser (e.g., PV waveform generator 175). The synchronization signal 502 may open and close the switch 622 based on whether the portion of the PV waveform cycle of a PV waveform is in the "on" or "off" state. Thus, within a cycle of the PV waveform, the impedance associated with the tuning circuit 312 may change to track impedance changes within the cycle, as described with respect to FIG. 4.

In some embodiments, a signal path 673 may be coupled in parallel with capacitive element 614. The signal path 673 may have a similar structure as the signal path 690. While not illustrated in FIG. 6A, in this configuration, the switch 622 of the parallel circuit 691 positioned within the signal path 673 will also receive a synchronization signal 502 from a suitable source. The signal path 690 may be used to perform matching for a real part of the impedance associated with the chamber and the signal path 673 may be used to perform matching for an imaginary part of an impedance associated with the chamber.

Figure 6B:
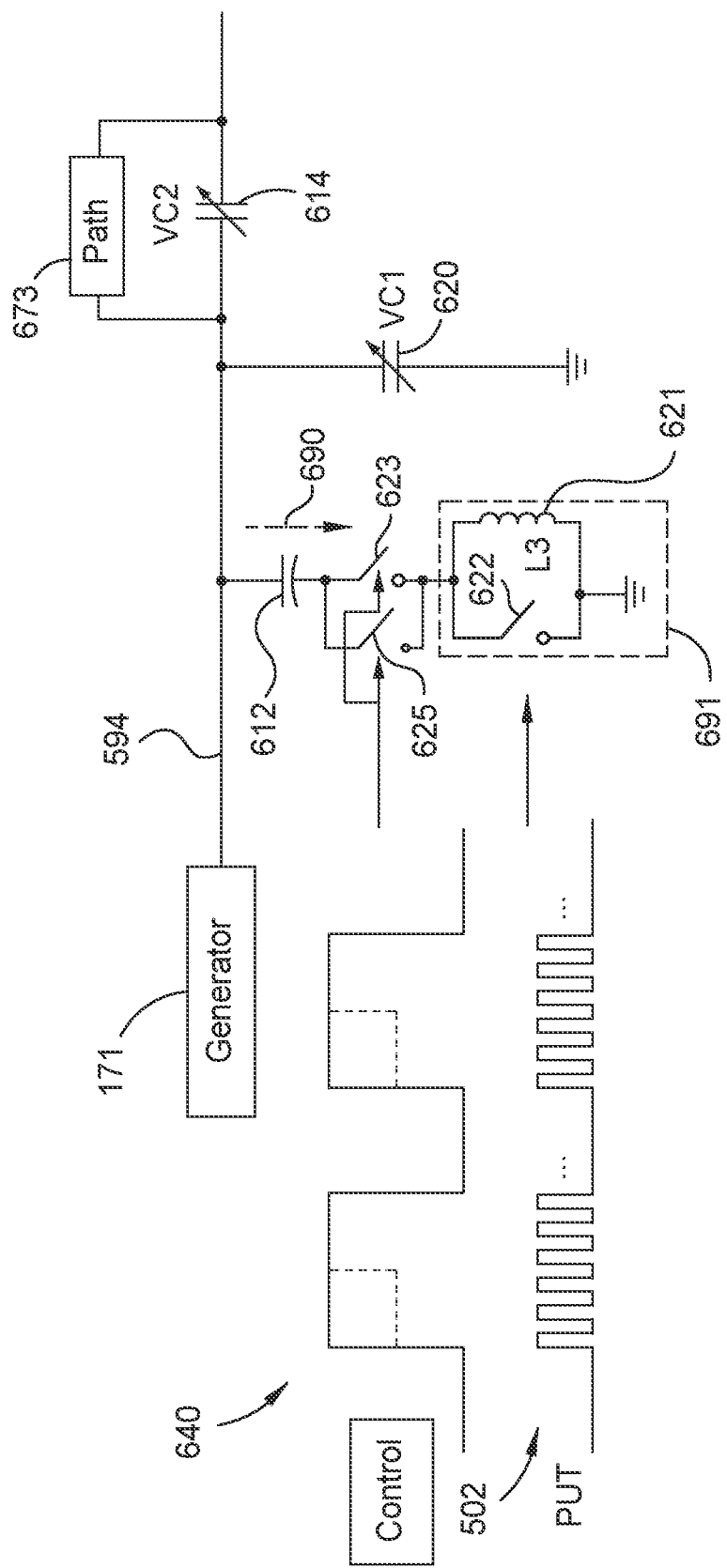

As shown in FIG. 6B, the signal path 690 may also include a switch 623 coupled between capacitive element 612 and the parallel circuit 691. The switch 623 may be driven by a control signal 640 that closes the switch 623 when the PV waveform is operating (e.g., when synchronization signal 502 is toggling), as shown. Either the rising edge or falling edge of the control signal 640 or synchronization signal 502 may be used to close the switch 623 or switch 622, respectively. As described, the switch 622 may be controlled by the synchronization signal 502, closing and opening the switch 622 based on whether the portion of the PV waveform cycle of a PV waveform is "on" or "off." Thus, in effect, the tuning circuit 312 may be operable to have multiple impedances by controlling the switches of the signal path 690. The signal path 690 may be being open-circuited by opening switch 623. The signal path 690 may be coupled in parallel with capacitive element 620 by closing switch 623. With the switch 623 closed, the inductive element 621 may be shorted by closing switch 622. Switch 622 may be opened, effectively coupling the capacitive element 612 and the inductive element 621 in series between terminal 594 and the reference potential node (e.g., electrical ground).

In some aspects, the control signal 640 may include multi-level pulsing signal that may be used to control multiple switches, as shown. A switch may be in parallel with switch 623 (or in series with switch 623). For instance, a switch 625 may be in parallel with switch 623, as shown. The control signal 640 may be used to control both switch 623 and switch 625. Switch 623 may have a different equivalent circuit component values (e.g., different diode junction capacitances) than switch 625. Equivalent impedances can be changed by combination and operation of the different switches 623, 625. In some other embodiments, the switch 625 can be in parallel or series with switch 622.

In some embodiments, a similar architecture may be implemented in parallel with capacitive element 614, facilitating tracking of the imaginary part of the chamber impedance within a cycle of the PV waveform, as shown in graph 450. For instance, as shown in FIG. 6A and FIG. 6B and discussed above, a signal path 673 may be in parallel with capacitive element 614.

Figure 6C:
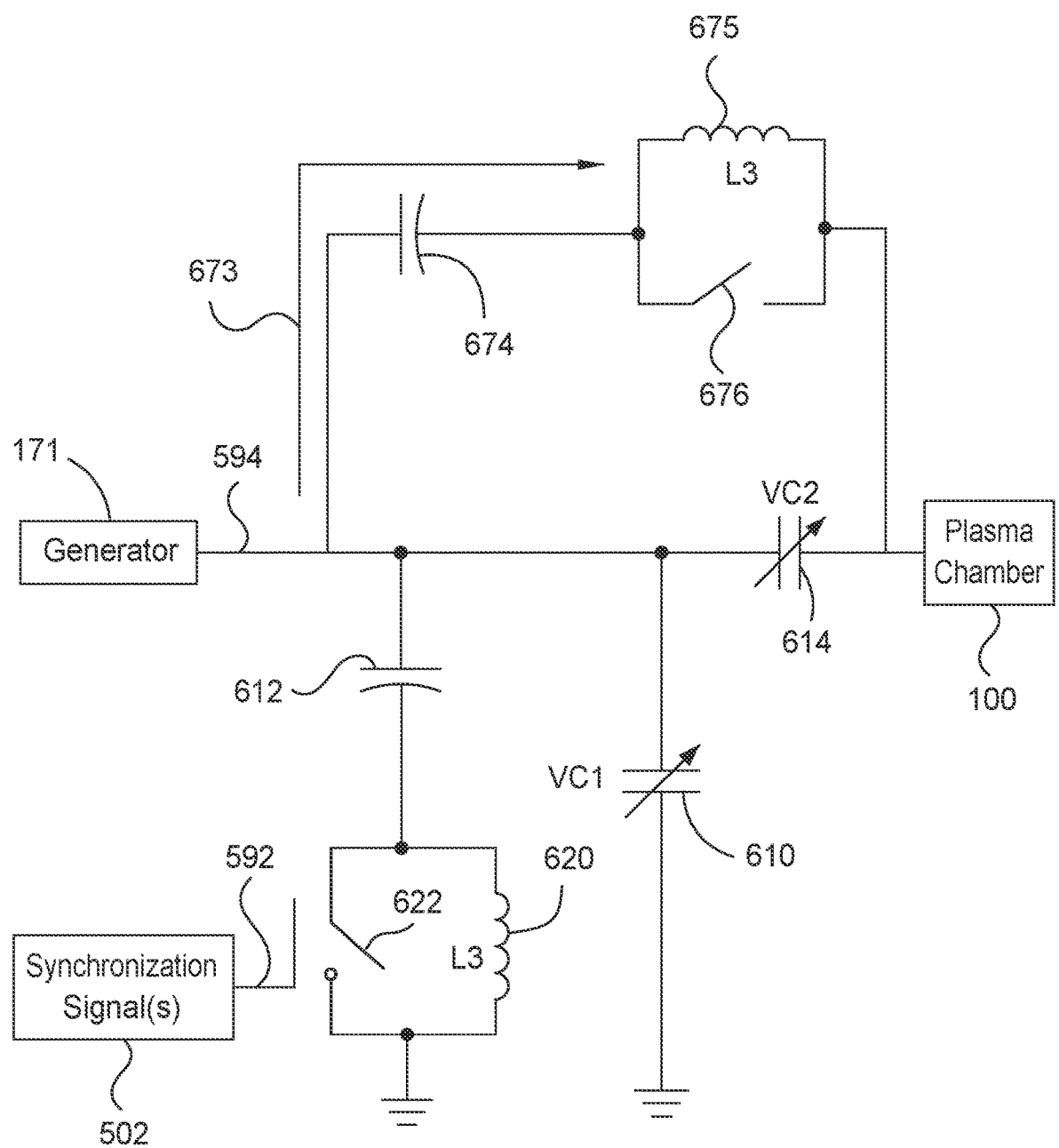

As shown in FIG. 6C, the signal path 673 may include a capacitive element and a parallel circuit similar to the capacitive element 612 and the parallel circuit 691. In some embodiments, the signal path 673 may include a capacitive element 674 and a parallel circuit including inductive element 675 in parallel with switch 676. Similar to signal path 690, the switch 676 of signal path 673 may be controlled to track the imaginary part of the chamber impedance within a cycle of the PV waveform. Similar to capacitive element 612, capacitive element 674 may be implemented with a fixed capacitance or as a variable capacitive element. In some embodiments, the capacitive element 674 is a variable capacitive element that is controlled by the controller 302 and/or the system controller 126.

Figure 6D:
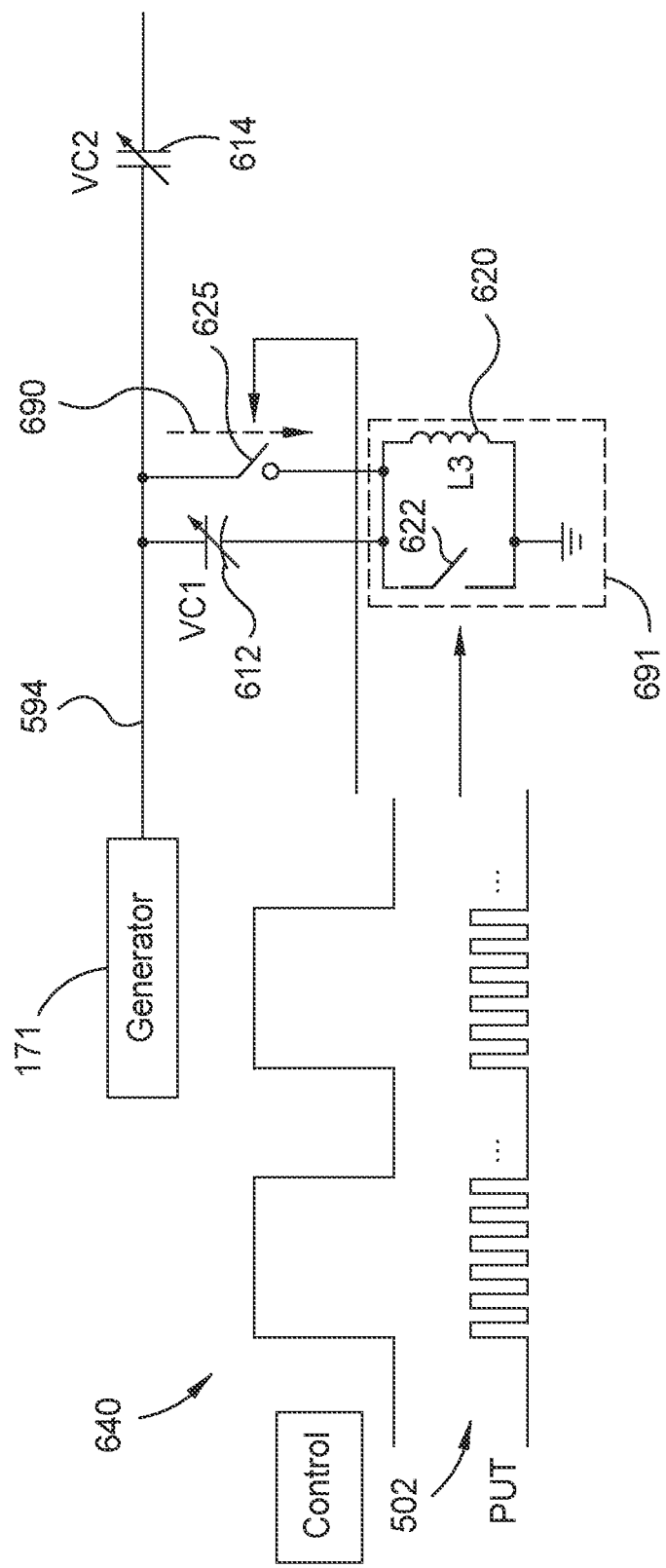

As shown in FIG. 6D, the tuning circuit 312 may include a switch 625 coupled in parallel with the capacitive element 612. A parallel circuit 691 having switch 622 in parallel with inductive element 621 may be coupled between switch 625 and the reference potential node. By controlling switches 625, 622, different impedances may be implemented for the tuning circuit 320. For example, switch 625 may be closed and switch 622 may be opened, resulting in only inductive element 621 being effectively coupled between terminal 594 and the reference potential node. Switches 622, 625 may be both opened, resulting in the inductive element 621 and the capacitive element 612 being effectively coupled in series between terminal 594 and the reference potential node. Switch 625 may be opened and switch 622 may be closed, resulting in only capacitive element 612 being coupled between terminal 594 and the reference potential node.

Figure 6E:
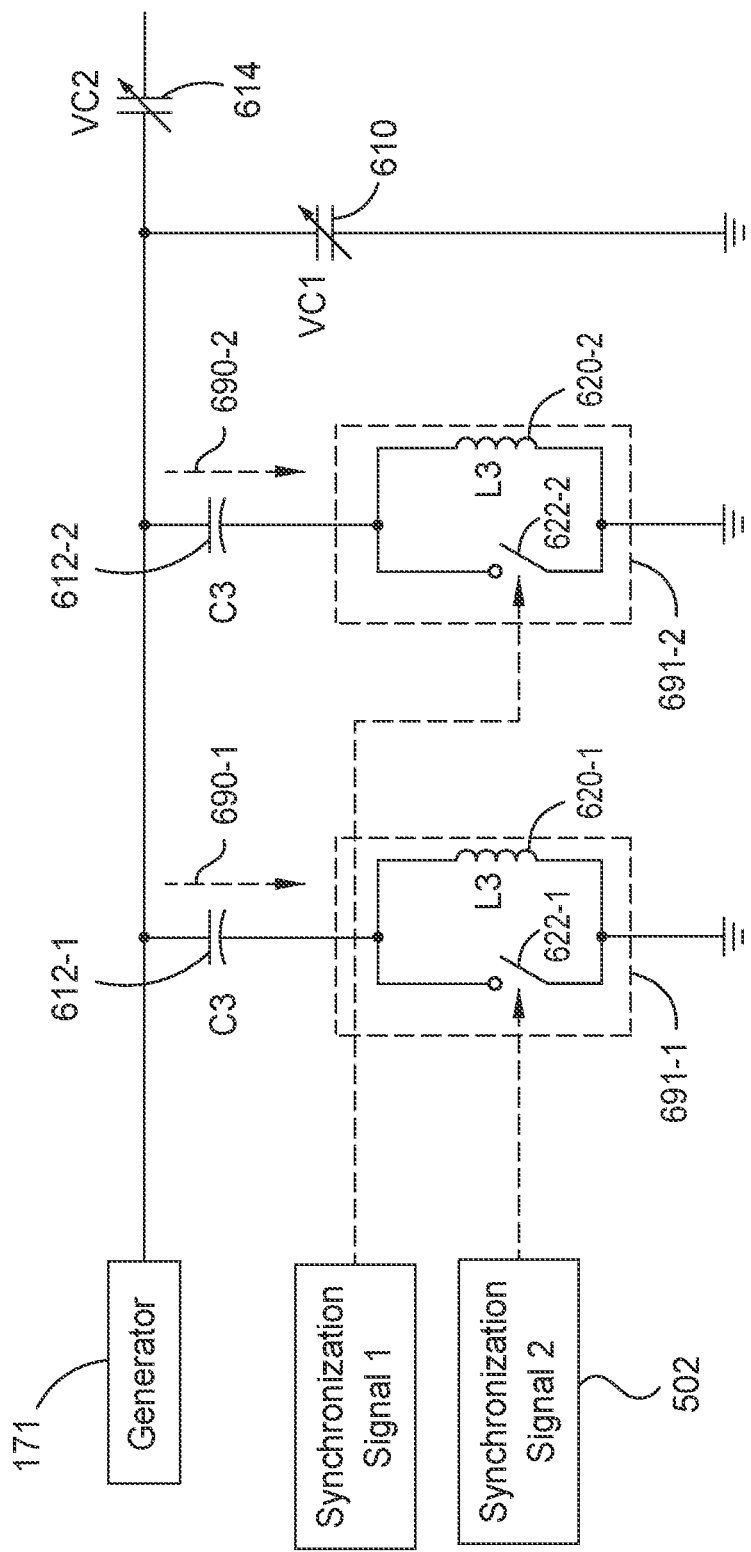

As shown in FIG. 6E, multiple parallel signal paths 690-1 and 690-2 may be implemented. In this configuration of the tuning circuit 312, each of the differently configured multiple parallel signal paths (e.g., signal paths 690-1 and/or 690-2) can be separately adjusted by use of one or more synchronization signals so that different impedances associated with the tuning circuit 312 can be rapidly altered to track changes in the load impedance within the PV waveform cycle, as described with respect to FIG. 4. In one example, at least one of the inductors 620-1 and 620-2 and capacitors 612-1 and 612-2 are different from each other, so that the impedances produced by the tuning circuit 312 can be altered at different times within a PV waveform cycle by use of the one or more synchronization signals provided from one or more sources. For example, signal path 690-1 may include capacitive element 612-1 coupled to a parallel circuit 691-1 having switch 622-1 in parallel with inductive element 620-1, and signal path 690-2 may include capacitive element 612-2 coupled to parallel circuit 691-2 having switch 622-2 in parallel with inductive element 620-2. While two signal paths are shown in FIG. 6E, any number of signal paths may be implemented in parallel with capacitive element 610 (or in parallel with capacitive element 614). As shown, a first synchronization signal (e.g., labeled "Synchronization Signal 1") may be used to control switch 622-1 and a second synchronization signal (e.g., labeled "Synchronization Signal 2") may be used to control switch 622-2. The first and second synchronization signals may be generated by the controller 126, in some embodiments.

Figure 6F:
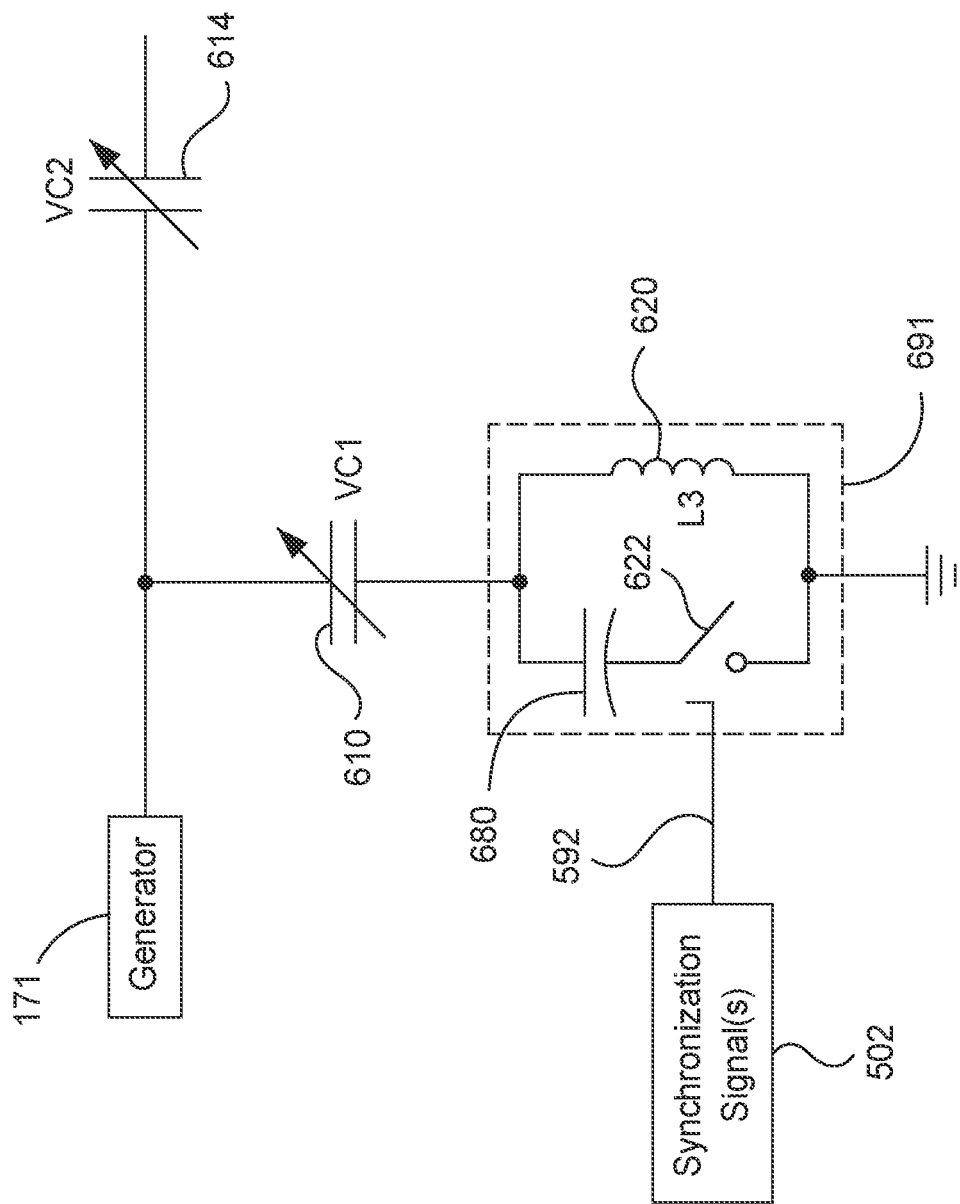

As shown in FIG. 6F, the parallel circuit 691 may include a capacitive element 680 in series with the switch 622, in some embodiments. Thus, when switch 622 is closed, the inductive element 621 is effectively in parallel with capacitive element 680, as shown. In this configuration, a resonant circuit having a desired resonant frequency is formed by adding the capacitive element 680 in series with the switch 622 in the parallel circuit 691.

Figure 6G:
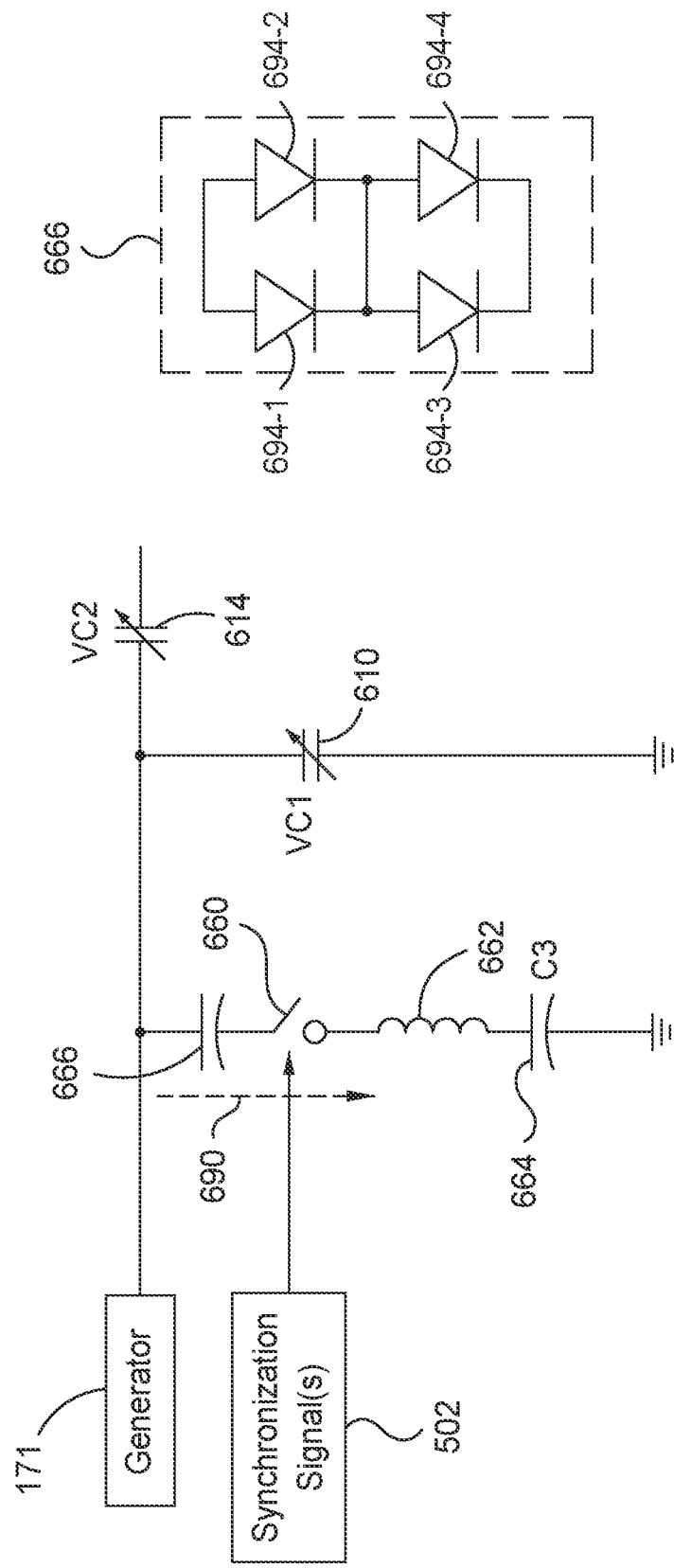

As shown in FIG. 6G, the signal path 690 may include capacitive element 666, switch 660, inductive element 662, and capacitive element 664, coupled in series. The switch 660 may be closed to effectively couple the signal path 690 in parallel with capacitive element 610. As shown in FIG. 6G, the switch 660 may be coupled between capacitive element 666 and inductive element 662, in some aspects. In some aspects, as shown in FIG. 6H, the switch 660 may be coupled between the inductive element 662 and the reference potential node (e.g., electrical ground). The switch 660 may be controlled using a synchronization signal 502 (e.g., driven by bias circuit 516). While certain embodiments are described with respect to a signal path in parallel with capacitive element 610 to perform matching for a real part of the impedance associated with the chamber, a similar signal path (e.g., having a similar circuit architecture) may be implemented in parallel with capacitive element 614 to perform matching for an imaginary part of an impedance associated with the chamber.

In some embodiments, the switches described herein may be implemented using any suitable type of switch. For example, each switch may be implemented using a Schottky diode switch, a positive-intrinsic-positive (PIN) diode switch, Gallium Nitride (GaN) metal-oxide-semiconductor field-effect transistor (MOSFET), Silicon Carbide (SIC) MOSFET, optical coupled MOSFET, micro-electromechanical systems (MEMS) based switches, or any switch using any other solid state switch technologies. Using a PIN diode switch may provide improved isolation for higher frequencies, such as higher RF frequencies. GaN and SiC MOSFETs may provide higher power ratings, faster speed, and may be suitable for lower RF frequency and higher on/off switching frequencies. As shown in FIG. 6G, multiple diodes (e.g., Schottky diodes 694-1, 694-2, 694-3, 694-4) may be cascaded, to implement a switch (e.g., switch 622 of FIGS. 6A to 6F or switch 660 of FIG. 6G) with a higher voltage and current capability. For example, when used to implement switch 660, anodes of diodes 694-1, 694-2 may be coupled to capacitive element 666 and cathodes of diodes 694-3, 694-4 may be coupled to inductive element 662.

Certain embodiments described herein may be implemented with frequency tuning. The trigger signal for controlling the switches of the tuning circuits described herein may include macro pulsing RF transistor-transistor (TTL) logic (e.g., signals provided from an RF generator that are synchronized with the periods of the RF pulses), or micro pulsing of PVT (e.g., signals provided from PV waveform generator that are synchronized with the periods of the PV waveform pulses), or from an external trigger board. For example, as described with respect to FIG. 6B, a control signal 640 may be provided from an RF generator (e.g., RF generator 171) and/or a synchronization signal 502 may be provided from PV waveform generator (e.g., PV waveform generator 175).

In some embodiments, the trigger signal may be based on an internal measurement (e.g., from a sensor with a user-defined threshold level). For example, a sensor (e.g., sensor 117) may be used to measure reflected power and control one or more switches of the tuning circuit based on the measurement. The embodiments disclosed herein will allow the altering of the states of the various switches to change the match impedance associated with the tuning circuit 312 in less than a microsecond time scale. The tuning circuit 312 may be implemented using lumped elements and/or distributed elements.

Certain embodiments provide a method for fast impedance tuning. First, the PV waveform may be configured in an off-stage (e.g., sheath collapse stage) and the switches of the tuning circuit 312 may be configured in a first state. For example, switch 622 may be open. The capacitance of the variable capacitive elements (e.g., capacitive elements 610, 614) of the tuning circuit 312 may be set to reduce (e.g., minimize) reflected power. Then, the PV waveform may transition to an on-stage (e.g., ion current stage). The capacitance of variable capacitive elements (e.g., capacitive elements 610, 614) of the tuning circuit 312 may be set to reduce (e.g., minimize) reflected power for the on-stage. This process may be repeated until a minimum reflected power is identified for the on-stage and the off-stage. If there are multiple switches (e.g., 622-1 and 622-2 of FIG. 6E), the process may be repeated until a minimum reflected power is identified for all states of the switches within the parallel circuits. During operation, with the PV waveform generator 175 operating, the synchronization signal 502 may be used to trigger and control the switches in open and closed states. The variable capacitive elements (e.g., capacitive elements 610, 614) may keep the same capacitance in some cases. The tuning circuit 312 performs impedance matching with fast switch transitions during a cycle of the PV waveform and tunes to impedance changes within the PV waveform cycle.

FIG. 7 is a process flow diagram illustrating a method 700 for processing a substrate in a plasma processing system, in accordance with certain embodiments of the present disclosure. The method 700 can be performed by a plasma processing system, such as the plasma processing system described with respect to FIG. 5 and FIGS. 6A-6G.

At operation 710, the plasma processing system generating a control signal (e.g., via controller 126) based on a PV waveform provided to an electrode of a processing chamber. In some aspects, the PV waveform may be used to generate a plasma in the processing chamber. Based on the delivery of the PV waveform, the impedance associated with the plasma may vary over time (e.g., during a cycle of the PV waveform). As described, an impedance of a tuning circuit may be adjusted to compensate for the variation of the impedance of the plasma.

At operation 720, the plasma processing system provides the control signal to a control input (e.g., control input 592) for a tuning circuit. The tuning circuit may include a first impedance (e.g., capacitive element 614) coupled between a first terminal (e.g., terminal 594) and a second terminal (e.g., terminal 596) of the tuning circuit. In some aspects, the first terminal is coupled to a generator (e.g., generator 171) and the second terminal is coupled to the processing chamber. The tuning circuit may also include a second impedance (e.g., capacitive element 610) coupled between the first terminal of the tuning circuit and a reference potential node. The tuning circuit may also include a signal path (e.g., signal path 690 or signal path 673) coupled to (e.g. coupled in parallel with) the first impedance or the second impedance. The signal path may include an inductive element (e.g., inductive element 621) and a first switch (e.g., switch 622) coupled to (e.g., coupled in parallel with) the inductive element. The signal path may include an inductive element (e.g., inductive element 621) and a first switch (e.g., switch 622) coupled in series with the inductive element. In some embodiments, a control input of the first switch is coupled to the control input of the tuning circuit.

In some aspects, a sensor may be used to detect a change in impedance associated with the plasma and change the impedance associated with the tuning circuit accordingly. For example, the first switch of the tuning circuit may be controlled based on the detected change in impedance. In some aspects, the impedance of the tuning circuit may be changed based on previous knowledge of plasma impedance changes during a cycle of the PV waveform.

In some embodiments, the signal path comprises a parallel circuit (e.g., parallel circuit 691) having the inductive element and the first switch. For example, the inductive element may be in parallel with the first switch. In some embodiments, the parallel circuit includes a capacitive element (e.g., capacitive element 680 shown in FIG. 6F) coupled in series with the first switch. In some embodiments, the signal path is coupled in parallel with the first impedance or the second impedance. In some embodiments, the signal path may include a capacitive element (e.g., capacitive element 612) coupled to the parallel circuit. The signal path may also include a second switch (e.g., switch 623 shown in FIG. 6B) coupled between the capacitive element and the parallel circuit. In some cases, the signal path includes a second switch (e.g., switch 625 shown in FIG. 6D) coupled in parallel with the second impedance.

In some embodiments, the signal path is in parallel with the first impedance or the second impedance, and the first switch (e.g., switch 660 shown in FIG. 6G) may be in series with the inductive element (e.g., inductive element 662 shown in FIG. 6G). The signal path may include at least one capacitive element (e.g., capacitive element 666 and/or capacitive element 664) in series with the inductive element.

In some embodiments, the plasma processing system may include a controller (e.g., controller 126) having an output coupled to the control input of the tuning circuit. The controller may generate the control signal based on the PV waveform and provide the control signal to the control input of the tuning circuit. The PV waveform may be delivered to an electrode disposed within a plasma chamber of the plasma processing system.

In some embodiments, the control signal controls the first switch based on stage transitions associated with the PV waveform. For example, the control signal may control the first switch based on a processing chamber being in a sheath collapse stage or an ion current stage.

While the foregoing is directed to embodiments of the present disclosure, other and further embodiments of the disclosure may be devised without departing from the basic scope thereof, and the scope thereof is determined by the claims that follow.

What is claimed is:
1. A tuning circuit, comprising:
a first impedance circuit coupled between a first terminal and a second terminal of the tuning circuit, wherein the first terminal is coupled to a generator and the second terminal is coupled to a load, the first impedance circuit being on a series path between the first terminal and the second terminal;
a second impedance circuit coupled between the first impedance circuit and a reference potential node; and a signal path coupled to the first impedance circuit or the second impedance circuit, the signal path comprising an inductive element and a first switch coupled in parallel with the inductive element to form a parallel circuit, the parallel circuit being between the series path and the reference potential node, wherein a control input of the first switch is coupled to a control input of the tuning circuit configured to receive a control signal associated with a pulsed voltage (PV) waveform.

2. The tuning circuit of claim 1, wherein the parallel circuit further comprises a capacitive element coupled in series with the first switch.

3. The tuning circuit of claim 1, wherein the signal path including the parallel circuit is coupled in parallel with the first impedance circuit or the second impedance circuit.

4. The tuning circuit of claim 1, wherein the signal path further comprises a capacitive element coupled to the parallel circuit.

5. The tuning circuit of claim 4, wherein the signal path further comprises a second switch coupled between the capacitive element and the parallel circuit.

6. The tuning circuit of claim 1, wherein the signal path further comprises a second switch coupled in parallel with the second impedance circuit, the second switch being between the parallel circuit and the first terminal.

7. The tuning circuit of claim 1, wherein the signal path is in parallel with the first impedance circuit or the second impedance circuit, the first switch being in series with the inductive element.

8. The tuning circuit of claim 7, wherein the signal path comprises at least one capacitive element in series with the inductive element.

9. A plasma processing system having the tuning circuit of claim 1, the plasma processing system further including a controller having an output coupled to the control input of the tuning circuit, wherein the controller is configured to:
generate the control signal based on the PV waveform; and
provide the control signal to the control input of the tuning circuit.

10. The plasma processing system of claim 9, further comprising a PV waveform generator configured to deliver the PV waveform to an electrode disposed within a plasma chamber of the plasma processing system.

11. The tuning circuit of claim 1, wherein the control signal is configured to control the first switch based on stage transitions associated with the PV waveform.

12. The tuning circuit of claim 1, wherein the control signal is configured to control the first switch based on a processing chamber being in a sheath collapse stage or an ion current stage.

13. A match circuit, comprising:
a tuning circuit including:
a first impedance circuit coupled between a first terminal and a second terminal of the tuning circuit, wherein the first terminal is coupled to a generator and the second terminal is coupled to a load;
a second impedance circuit coupled between the first impedance circuit and a reference potential node; and
a signal path coupled to the first impedance circuit or the second impedance, the signal path comprising an inductive element and a first switch coupled to the inductive element, wherein a control input of the first switch is coupled to a control input of the tuning circuit configured to receive a control signal associated with a pulsed voltage (PV) waveform; and
a bias circuit; and
a filter coupled between the control input of the tuning circuit and an output of the bias circuit.

14. A method of processing a substrate in a plasma processing system, comprising:
generating a control signal based on a pulsed voltage (PV) waveform provided to an electrode of a processing chamber; and
providing the control signal to a control input for a tuning circuit, the tuning circuit further comprises:
a first impedance circuit coupled between a first terminal and a second terminal of the tuning circuit, wherein the first terminal is coupled to a generator and the second terminal is coupled to the processing chamber, the first impedance circuit being on a series path between the first terminal and the second terminal;
a second impedance circuit coupled between the first impedance circuit and a reference potential node; and
a signal path coupled to the first impedance circuit or the second impedance circuit, the signal path comprising an inductive element and a first switch coupled in parallel with the inductive element to form a parallel circuit, the parallel circuit being between the series path and the reference potential node, wherein a control input of the first switch is coupled to the control input of the tuning circuit.

15. The method of claim 14, further comprising controlling, via the control signal, the first switch based on stage transitions associated with the PV waveform.

16. The method of claim 14, further comprising controlling, via the control signal, the first switch based on the processing chamber being in a sheath collapse stage or an ion current stage.

17. An apparatus for processing a substrate in a plasma processing system, comprising:
a pulsed voltage (PV) waveform generator configured to generate a PV waveform provided to an electrode of a processing chamber;
a tuning circuit including:
a first impedance circuit coupled between a first terminal and a second terminal of the tuning circuit, the first impedance circuit being on a series path between the first terminal and the second terminal;
a second impedance circuit coupled between the first terminal of the tuning circuit and a reference potential node; and
a signal path coupled to the first impedance circuit or the second impedance circuit, the signal path comprising an inductive element and a first switch coupled in parallel with the inductive element to form a parallel circuit, the parallel circuit being between the series path and the reference potential node, wherein a control input of the first switch is coupled to a control input of the tuning circuit; and
a controller configured to provide a control signal to the control input of the tuning circuit based on the PV waveform.

* * * * *